(12) United States Patent
Lin et al.

(10) Patent No.: US 8,470,671 B1
(45) Date of Patent: Jun. 25, 2013

(54) METHOD OF MANUFACTURING A 3-D VERTICAL MEMORY

(71) Applicant: Powerchip Technology Corporation, Hsinchu (TW)

(72) Inventors: Chao-Wei Lin, Hsinchu County (TW); Hui-Huang Chen, Changhua County (TW); Chih-Yuan Chen, Hsinchu (TW)

(73) Assignee: Powerchip Technology Corporation, Hsinchu Science Park, Hsinchu (TW)

( * ) Notice: Subject to any disclaimer, the term of this patent is extended or adjusted under 35 U.S.C. 154(b) by 0 days.

(21) Appl. No.: 13/658,816

(22) Filed: Oct. 24, 2012

(30) Foreign Application Priority Data

Jul. 11, 2012 (TW) .............................. 101124977 A (51) Int. Cl.
*H01L 21/336* (2006.01)
(52) U.S. Cl.
USPC ........... 438/268; 438/270; 438/264; 438/266; 257/E21.41
(58) Field of Classification Search
USPC ................. 438/268, 212, 270, 264, 272, 266; 257/E21.41
See application file for complete search history.

(56) References Cited

U.S. PATENT DOCUMENTS

| 8,178,919 | B2* | 5/2012 | Fujiwara et al. | 257/324 |
| 8,349,689 | B2* | 1/2013 | Lee et al. | 438/268 |
| 2010/0013049 | A1* | 1/2010 | Tanaka et al. | 257/532 |
| 2010/0117137 | A1* | 5/2010 | Fukuzumi et al. | 257/324 |
| 2010/0181612 | A1* | 7/2010 | Kito et al. | 257/319 |
| 2011/0032772 | A1* | 2/2011 | Aritome | 365/185.29 |

OTHER PUBLICATIONS

Jiyoung Kim, Novel Vertical-Stacked-Array-Transistor (VSAT) for ultra-high-density and cost-effective NAND Flash memory devices and SSD (Solid State Drive), 2009 Symposium on VLSI Technology Digest of Technical Papers, Jun. 16, 2009, pp. 186-187.
Ryota Katsumata, Pipe-shaped BiCS Flash Memory with 16 Stacked Layers and Multi-Level-Cell Operation for Ultra High Density Storage Devices, 2009 Symposium on VLSI Technology Digest of Technical Papers, Jun. 16, 2009, pp. 136-137.

* cited by examiner

*Primary Examiner* — Michael Trinh
(74) *Attorney, Agent, or Firm* — Winston Hsu; Scott Margo (57) ABSTRACT

A novel method for manufacturing a 3-D vertical memory comprising the steps of dividing a multilayer structure composed of insulating intermediate layers and sacrificial intermediate layers into a first multilayer structure and a second multilayer structure, replacing the sacrificial intermediate layers in the multilayer structures with metal intermediate layers, and manufacturing the channel structure in two multilayer structures.

17 Claims, 13 Drawing Sheets

METHOD OF MANUFACTURING A 3-D VERTICAL MEMORY

BACKGROUND OF THE INVENTION

1. Field of the Invention

The present invention generally relates to a method of manufacturing a 3-D vertical memory, and more particularly, to a method of manufacturing a 3-D vertical memory with U-shaped pipe channel structures.

2. Description of the Prior Art

In the conventional planar type memory structure field, since the components of a memory cell, such as the gate, the source and the drain, are all formed on the same plane, the area of a memory cell (generally $4F^2$, wherein F is the exposure limitation of the photolithographic tool) can only be scaled down by changing the critical dimension (CD) in the exposure process performed by photolithographic tool. For this kind of planar type memory design, it is impossible to significantly increase the number of memory cells in a memory array. Especially, the current memory processes have regular critical dimensions configured to be smaller than 40 nm. The available photolithographic tool with such exposure capability is exorbitantly expensive. The cost of research and development for this kind of semiconductor processes is accordingly too costly. In order to respond the aforementioned cost issue, many novel processes based on using common, existing photolithographic tools have been developed in the industry in order to manufacture devices or circuit structures with more compact architectures. However, those proposed processes are mostly complicated and are showing lower product yields. Moreover, for planar type memory structures, serious crosstalk problem may occur between adjacent memory units when the size is scaled down to a threshold level. These crosstalk phenomena may deteriorate the original electrical performances of the memory device. Therefore, the aforementioned difficulties are no doubt hindering the scaling-down progression of the memory sizes.

In the light of the limitation in the size scale-down for current planar type memory structures, the development of three dimension (3-D) vertical stacked memory architectures has been initiated in the industry in order to significantly increase the number of memory cells in one memory array. In the so-called 3-D vertical memory structures, the control gates of the memory device are vertically stacked, so that the necessary area for the memory cell may be significantly reduced. For example, the area of a memory cell in this kind of 3-D architecture is generally $6F^2/N$, wherein F is the exposure limitation of the used photolithographic tool, and N is the number of stacked control gates. Most important, the existing common process tools are well-adapted to perform the process of manufacturing this kind of 3-D vertical memory structures, thus there is no need to invest huge cost in purchasing expensive process tools or developing brand-new technologies.

Currently, there are two developed 3D vertical memory candidates in the industry, one is the pipe-shaped bit cost scalable (P-BiCS) technology, and the other one is the terabit cell array transistor (TCAT) technology. Both of these two memory technologies have their own advantages and disadvantages in nature.

As far as P-BiCS technology is concerned, please refer to the article in reference "2009 Symposium on VLSI Technology Digest of Technical Papers", section 7-1, entitled "Pipe-shaped BiCS Flash Memory with 16 Stacked Layers and Multi-Level-Cell Operation for Ultra High Density Storage Devices". As shown in FIG. 1 and FIG. 2 of this article, the storage signal is transmitted from the upper source lines (SL) to the topmost bit lines (BL) through a U-shaped pipe connection (PC). The U-shaped pipe connection is designed to run through a plurality of stacked control gates (CG) and cooperatively complete the operation of data storage. The advantage of the P-BiCS technology is that the source lines are disposed on the upper portion of the memory structure, thus the source line may be made of metal materials with lower resistance so as to improve the electrical performances. However, in current P-BiCS process, the control gate portion can not be made by using metal materials, thus the word line (WL) in this structure will have higher RC values, which may influence the electrical performances of memory device and also make it difficult to perform the contact process for the word lines in following processes.

On the other hand, as far as the TCAT technology is concerned, please refer to the article in reference "2009 Symposium on VLSI Technology Digest of Technical Papers", section 10A-1, entitled "Novel Vertical-Stacked-Array-Transistor (VSAT) for ultra-high-density and cost-effect NAND Flash memory devices and SSD (Solid State Drive)". As shown in FIG. 1 and FIG. 2 in this article, the storage signal is designed to be transmitted upwardly from the bottom source select line (SSL) to the upper bit line through a plurality stacked control gate structures. The advantage of the TCAT technology is that the control gate may be made of metal materials, so the word lines in this structure may have lower RC values. However, the disadvantage of the TCAT technology is that the source line is formed on the lower Poly-Si layer, thus the source line cannot be made out of metal materials and will have high resistances, which may influence the electrical performances of memory device.

Accordingly, both of the aforementioned two 3-D vertical stacked memory technologies have their drawbacks in their structure or process nature. How to improve these technologies and overcome the existing drawbacks is still one of essential topic for those of ordinarily skilled in the art.

SUMMARY OF THE INVENTION

In the light of the above-mentioned drawbacks in prior art, a method of manufacturing a novel 3-D vertical memory device is provided in present invention. The memory device manufactured by the method of present invention may have the advantages of the aforementioned P-BiCS technology and TCAT technology, and improves the current process flow for the 3-D vertical memory device.

The manufacturing process of the present invention is based on P-BiCS memory structures. Metal control gates may be formed inside the memory cell by replacement method in present invention in order to overcome the drawbacks of the P-BiCS technology without conceding the original advantages.

The object of present invention is to provide a novel method of manufacturing a 3-D vertical memory which comprises the steps of forming a multilayer structure composed of a plurality of alternatively stacked insulating intermediate layers and sacrificial intermediate layers on a sacrificial bottom layer of a substrate, dividing the multilayer structure into a first multilayer structure and a second multilayer structure, forming an insulating layer encompassing the first multilayer structure and the second multilayer structure, forming a plurality of through holes penetrating through the first multilayer structure and the second multilayer structure, removing the sacrificial intermediate layers in the first multilayer structure and the second multilayer structure through the through holes to form empty intermediate spaces, forming metal layers in the intermediate spaces through the through holes, forming a plurality of through holes penetrating through the first multilayer structure and the second multilayer structure, removing the sacrificial bottom layer through the through holes to form a empty bottom space, and forming interconnected channel structures in the through holes and the bottom space.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles.

In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the exemplary embodiment, reference is made to the accompanying drawings, which form apart thereof and are illustrated by way of specific embodiments in which the invention may be practiced. These embodiments are described in sufficient details to allow those skilled in the art to practice the invention. It is to be understood that other embodiments may be utilized and structural, logical, or electrical changes may be made without departing from the scope of the present invention. Accordingly, the following detailed description is not to be taken in a limiting sense, and the scope of the present inventions is defined only by the appended claims. Furthermore, certain terms are used throughout the following descriptions and claims to refer to specific components. As one skilled in the art will appreciate, consumer electronic equipment manufacturers may refer to a component by different names, for example, dielectric layer and insulating layer.

Figure 13:
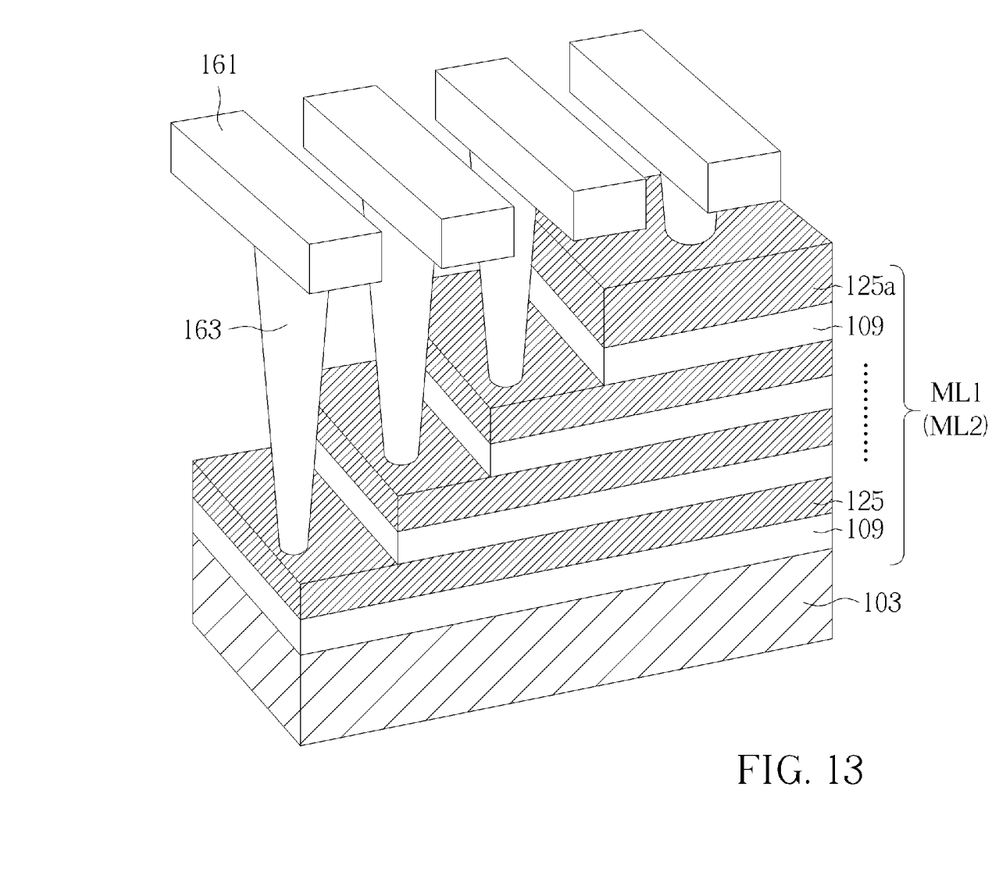
FIG. 13 is a schematic view illustrating the connection of individual metal control gates and a comb-like contact structure in the 3-D vertical memory structure according to the second embodiment of the present invention.

The exemplary embodiments will now be explained with reference to the accompanying drawings to provide a better understanding of the process of the present invention, wherein FIGS. 1-12 are schematic views illustrating the process flow of a novel 3-D vertically stacked memory structure, ex. a 3-D vertical NAND flash in accordance with the exemplary embodiment of the present invention. Parts of the memory structure in these figures, for example the front portion and the side portion, are shown in a cross-sectional aspect to explicitly illustrate the detailed inner features of the stacked memory structure. FIG. 13 is a schematic view illustrating the connection of respective metal control gates and a comb-like contact structure in the 3-D vertical memory structure according to the exemplary embodiment of the present invention.

The process proposed in present invention is an improvement of the conventional U-shaped/pipe-shaped 3-D vertical memory structure and the manufacturing method thereof. The invention integrates the advantages of both aforementioned P-BiCS memory structure and TCAT memory structure. One essential feature of the present invention is that the control gate (CG) and the source line (SL) may be made of metal materials with lower resistance. Therefore, the problem of high RC value and high resistance resulting from non-metal word lines (WL) and source lines in conventional vertical memory structures can be properly solved in present invention.

Figure 1:
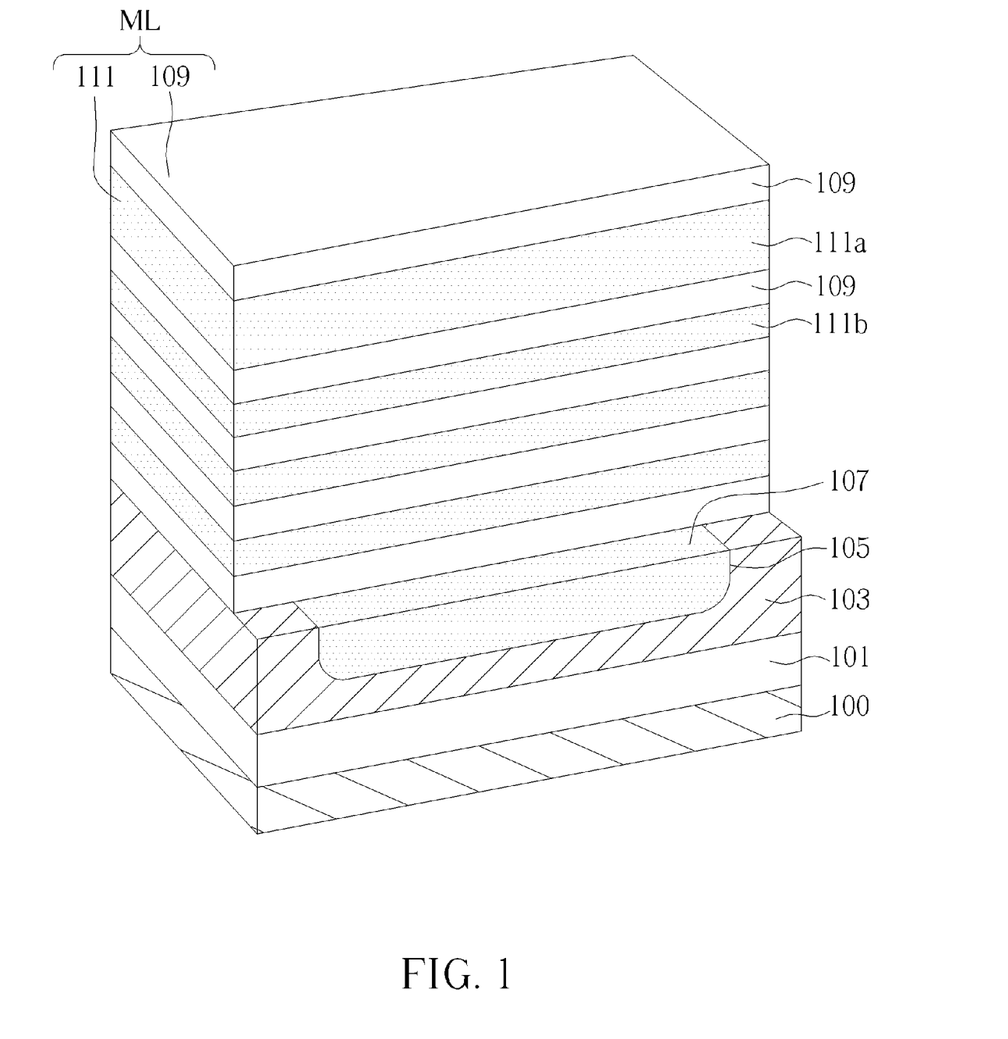
FIGS. 1-12 are schematic views illustrating the process flow of manufacturing a novel 3-D vertical memory structure in accordance with the first embodiment of the present invention.

Please refer to FIG. 1. In the beginning of the process flow, a substrate 100 is first provided to serve as a base for constructing the 3-D vertical memory structure of the present invention. The substrate 100 may be a mono-crystalline silicon wafer or a silicon-on-insulator (SOI) substrate. The substrate 100 is provided with an insulating layer 101 and an active layer 103 formed thereon in order, wherein the material of the insulating layer 101 may be non-conductive silicon oxide ($SiO_2$) which may insulate the underlying substrate 100 and the overlying active layer 103. The insulating layer 101 may also serve as an etch-stop layer in later etching processes. The material of the active layer 103 may be poly-crystalline silicon which may serve as a back gate (BG) of the 3-D vertical memory structure by forming specific conductive regions through ion implantation processes. The bottom portion (i.e. the horizontal portion) of the U-shaped pipe channel in the memory structure is designed to pass through the active layer 103 and connect with the two upper vertical portions of the U-shaped pipe channel. The relevant detailed description will be disclosed in following embodiment.

In order to manufacture the bottom channel portion of the U-shaped pipe channel structure, a shallow recess 105 is first formed on the active layer 103 by a photolithographic process to serve as a predetermined space for the bottom channel portion. The shallow recess 105 is then filled up with sacrificial material (referred hereinafter as a sacrificial bottom layer 107). The material of the sacrificial bottom layer 107 may be silicon nitride (SiN) which has a high etching selectivity in comparison to the active layer 103 made of poly-Si material, so as to facilitate the removal of the sacrificial bottom layer 107 by an etching process or a chemical mechanism polishing (CMP) process in following processes.

After the base of the memory structure is prepared, a multilayer body ML is formed on the common surface of the sacrificial bottom layer 107 and the active layer 103. The multilayer body ML encompasses the region of the sacrificial bottom layer 107 and a portion of the active layer 103. In the embodiment of present invention, the multilayer structure ML consists of a plurality of alternatively stacked insulating intermediate layers 109 and sacrificial intermediate layers 111. The materials of insulating intermediate layers 109 and the sacrificial intermediate layers 111 are respectively $SiO_2$ and SiN, which have high etching selectivity so as to selectively remove the sacrificial intermediate layer 111 in later etching processes. The topmost layer and bottommost layer of the multilayer body ML must be insulating intermediate layers 109 in order to electrically insulate the conductive active layer 103 at the bottom of the multilayer body ML and the source lines (SL) and bit lines (BL) to be formed at top of the multilayer body ML from the adjacent layer structures. In present invention, the number of stacked layers in multilayer body ML may be 8, 16 or up to 32. The higher the number of stacked layers will be, the higher the number of memory cells that may be manufactured per unit volume. In the preferred embodiment of present invention, the topmost sacrificial intermediate layer 111a of the multilayer structure ML is designed to form select gates (SG), while other lower sacrificial intermediate layers 111b are designed to form individual control gates (CG). Preferably, the topmost sacrificial intermediate layer 111a is thicker than the lower sacrificial intermediate layers 111b. For example, the thickness of the topmost sacrificial intermediate layer 111a may be about two or three times the thickness of lower sacrificial intermediate layers 111b.

Figure 2:
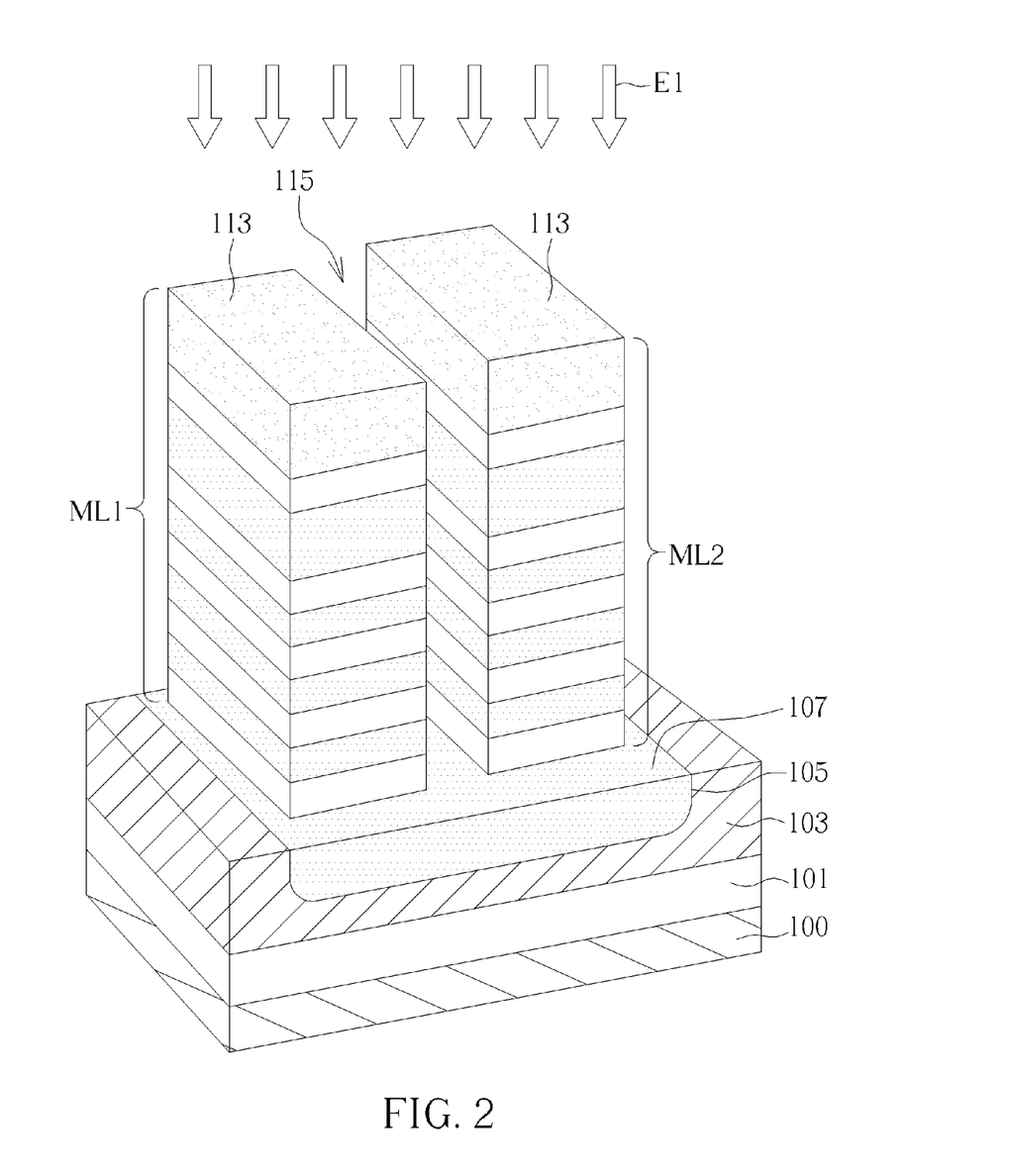

After completing the multilayer structure ML, please refer to FIG. 2, a patterned photoresist 113 is covered on the multilayer structure ML. An anisotropic etching process E1 is then performed to form a gap 115 in the middle of the multilayer body ML. The gap 115 will stop on the sacrificial bottom layer 107 at the bottom of the multilayer body ML, so that the multilayer body ML is divided into a first multilayer body ML1 and a second multilayer body ML2. In the embodiment of present invention, the reason of dividing the multilayer structure ML is to provide two individual multilayer bodies for constructing respective vertical channel portions (referred hereinafter as left channel portion and right channel portion) of the U-shaped pipe channel structure. Furthermore, the gap 115 formed between the multilayer bodies ML1 and ML2 may be filled up with intermediate material to form a common supporting structure or a frame. This design may facilitate the manufacture of the U-shaped pipe channel structure in following processes. Detailed description will be explicitly disclosed in the embodiment with reference to FIG. 3.

Figure 3:
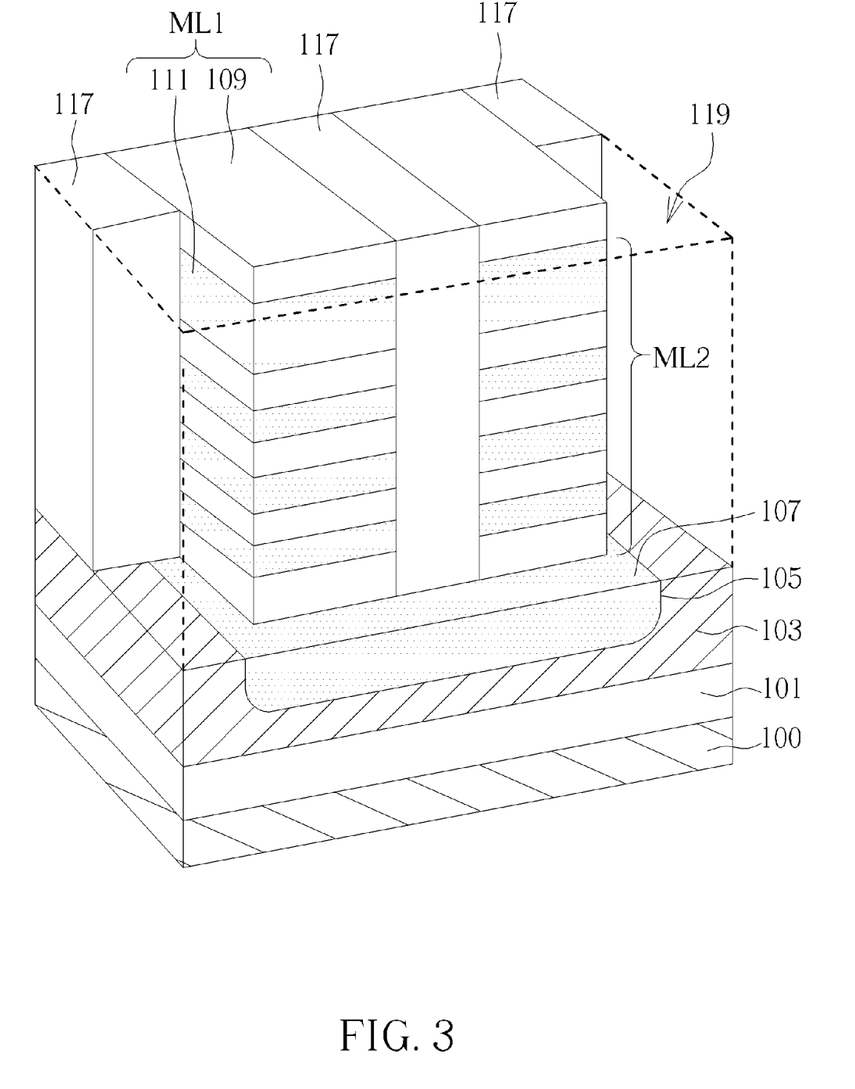

After the gap 115 is formed, please refer to FIG. 3, a deposition process is performed to form an inter-layer dielectric (ILD) 117 surrounding the two multilayer bodies ML1 and ML2. The material of ILD 117 may be the same as the one of the insulating intermediate layer 109 in the multilayer bodies, such as $SiO_2$, so that the ILD 117 and the insulating intermediate layer 109 may be combined into one common supporting structure 119. For the simplicity of the drawing, the figures after FIG. 3 will not be provided with the borderlines for distinguishing the ILD 117 from the encompassed two multilayer bodies ML1 and ML2. The whole structure will be shown with only one supporting structure in the figures. The reason of forming supporting structure 119 is to provide a structural support for the following replacement process of the sacrificial layer 111 and the process of manufacturing inner components of the U-shaped pipe channel structure.

Please note that, in the embodiment of present invention, the insulating intermediate layers 109 are actually surrounded by the ILD 117. This means that the insulating intermediate layers 109 are encompassed in the supporting structure 119, as indicated by the dash lines shown in FIG. 3. To simplify the description of the embodiment, the description and figures of the embodiment after FIG. 3 will omit the portion of the ILD 117 surrounding the insulating intermediate layer 109. Moreover, the detailed features in multilayer bodies ML1 and ML2 will be clearly shown with a cross-sectional view in the figure.

Figure 4:
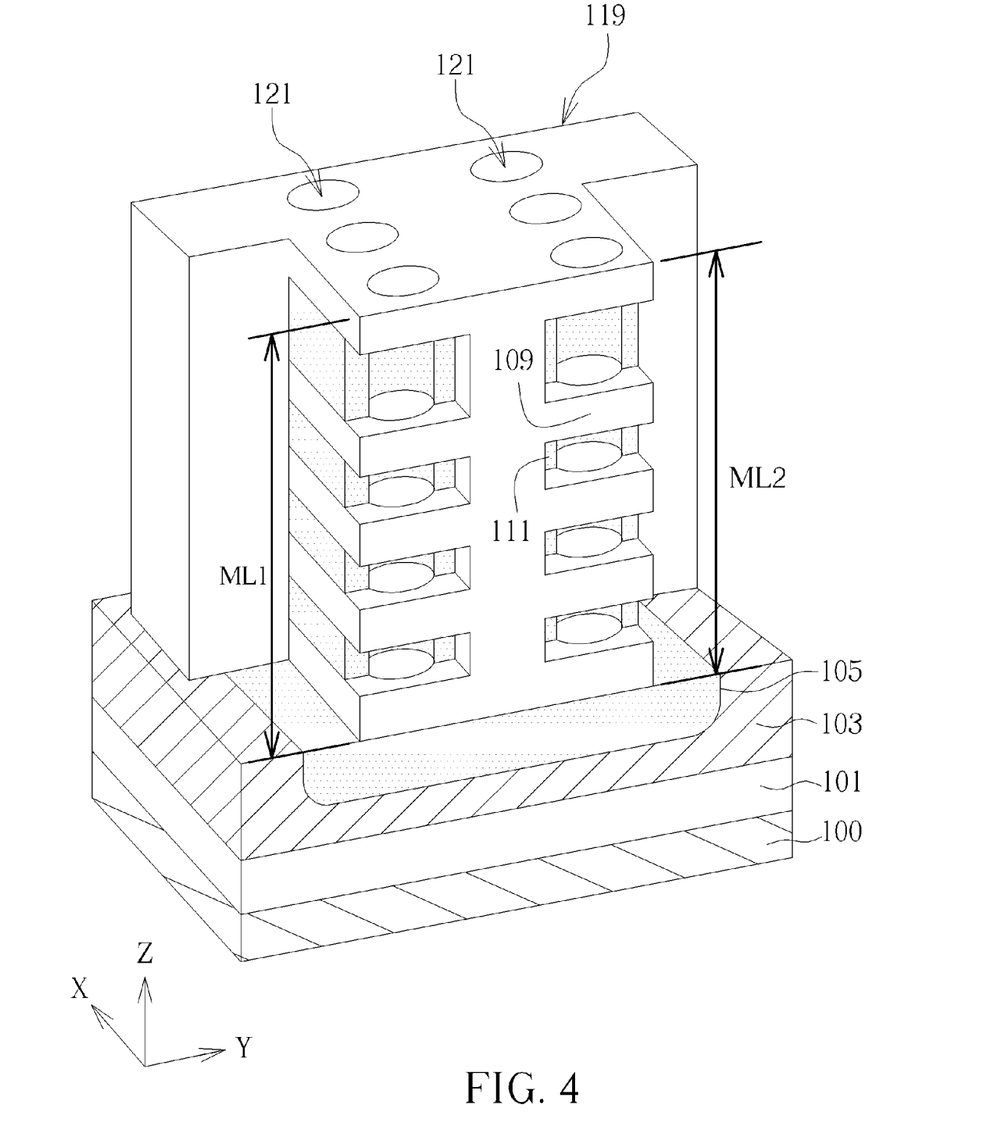

After forming the common supporting structure 119, please refer to FIG. 4, a plurality of through holes 121 are formed respectively penetrating through the two multilayer bodies ML1 and ML2. Preferably, the through holes 121 are aligned along a X direction shown in FIG. 4, and each through hole 121 in the multilayer body ML1 corresponds to one through hole in the multilayer body ML2. The two corresponding through holes serve respectively as the left vertical channel portion and the right vertical channel portion of a U-shaped pipe channel structure. The through holes 121 may be formed by a photolithographic process and a reactive ion etching (RIE) process. As shown in the figure, the through hole penetrates the whole multilayer bodies ML1 and ML2 which consist of alternatively stacked sacrificial intermediate layers 111 and insulating layers 109. Please note that, in order to explicitly illustrate the detailed features inside the multilayer bodies ML1 and ML2, parts of the sacrificial intermediate layer 111 around the through hole 121 is omitted in the figure to show the cross-sectional features in the through hole 121. In real condition, the through hole 121 is completely surrounded by the alternatively stacked sacrificial intermediate layers 111 and the insulating intermediate layers 109.

Figure 5:
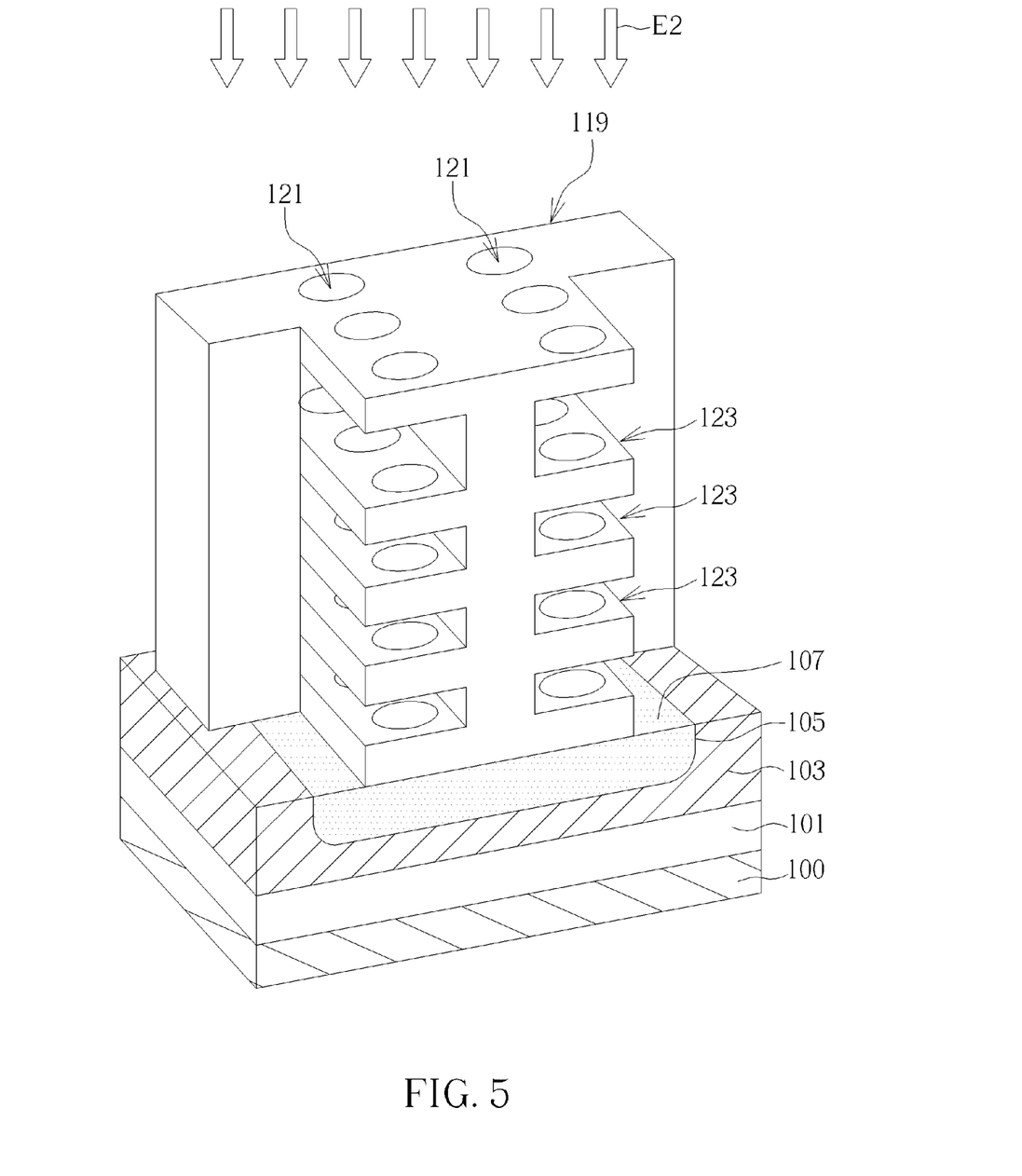

After the through holes 121 are formed in the multilayer bodies, please refer to FIG. 5, the sacrificial intermediate layers 111 between each insulating intermediate layer 109 are removed by an etching process E2 to form a supporting structure (or frame) 119 with multiple intermediate spaces 123. The aforementioned etching process E2 may be a wet etching process using hot phosphoric acid ($H_3PO_4$) as etchant. During the etching process, hot $H_3PO_4$ flows downwardly through every sacrificial layer 111 in the supporting structure 119. The sacrificial layer 111 made of SiN material will be removed by the hot $H_3PO_4$, thereby forming a plurality of spaced-apart intermediate spaces 123 communicating by the vertical through holes 121 penetrating therethrough in the supporting structure 119.

Figure 6:
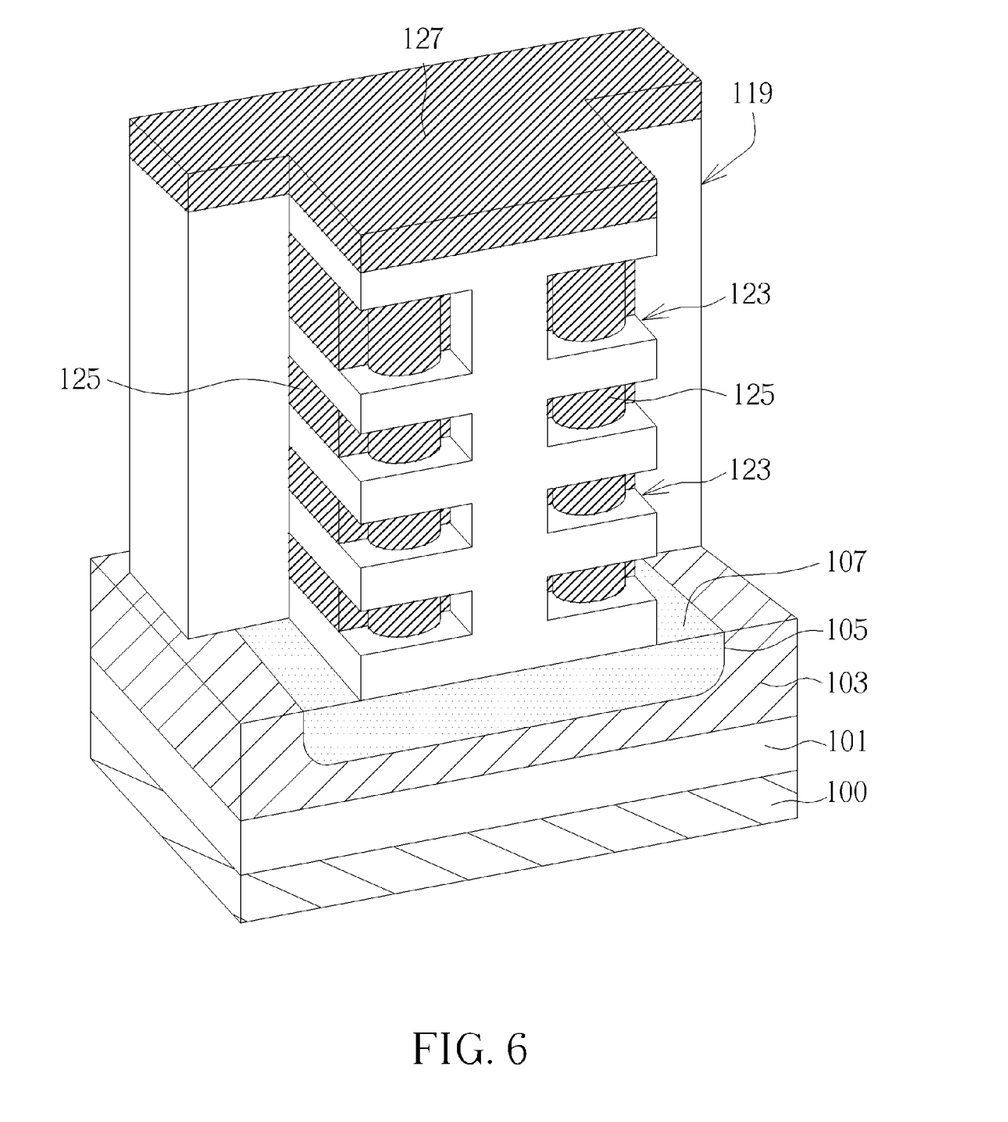

Please now refer to FIG. 6, the intermediate spaces 123 formed in previous process are then filled up with metal material, such as W, Ti, Co, Ni or the alloy thereof, through the through holes 121 communicating each intermediate space 123, thereby forming a metal layer 125 in each intermediate space 123. The replacement of the SiN sacrificial intermediate layers with metal material is, therefore, completed. The metal layer 125 in present invention is used to manufacture metal control gates and inner structures such as a barrier layer, a storage layer, a tunnel layer and a channel layer in the following processes. After forming the metal layers 125, the topmost metal layer 127 deposited on the supporting structure 119 will be removed by an etch-back process or a CMP process. Please note that, in order to explicitly illustrate the features inside the through hole, parts of the metal layer 125 around the through hole are omitted in the figure. In fact, the metal layers 125 formed in this step fill up each intermediate space 123, including the through holes 121. The figures after FIG. 6 will all be illustrated in this manner to show the detailed features inside the through hole.

The replacement of the sacrificial intermediate layer with metal material is achieved through the through holes 121 and the supporting structure 119. In present invention, the control gate made of metal material has a lower resistance than the conventional poly-Si control gate. The electrical performances of the memory structure are accordingly improved.

Figure 7:
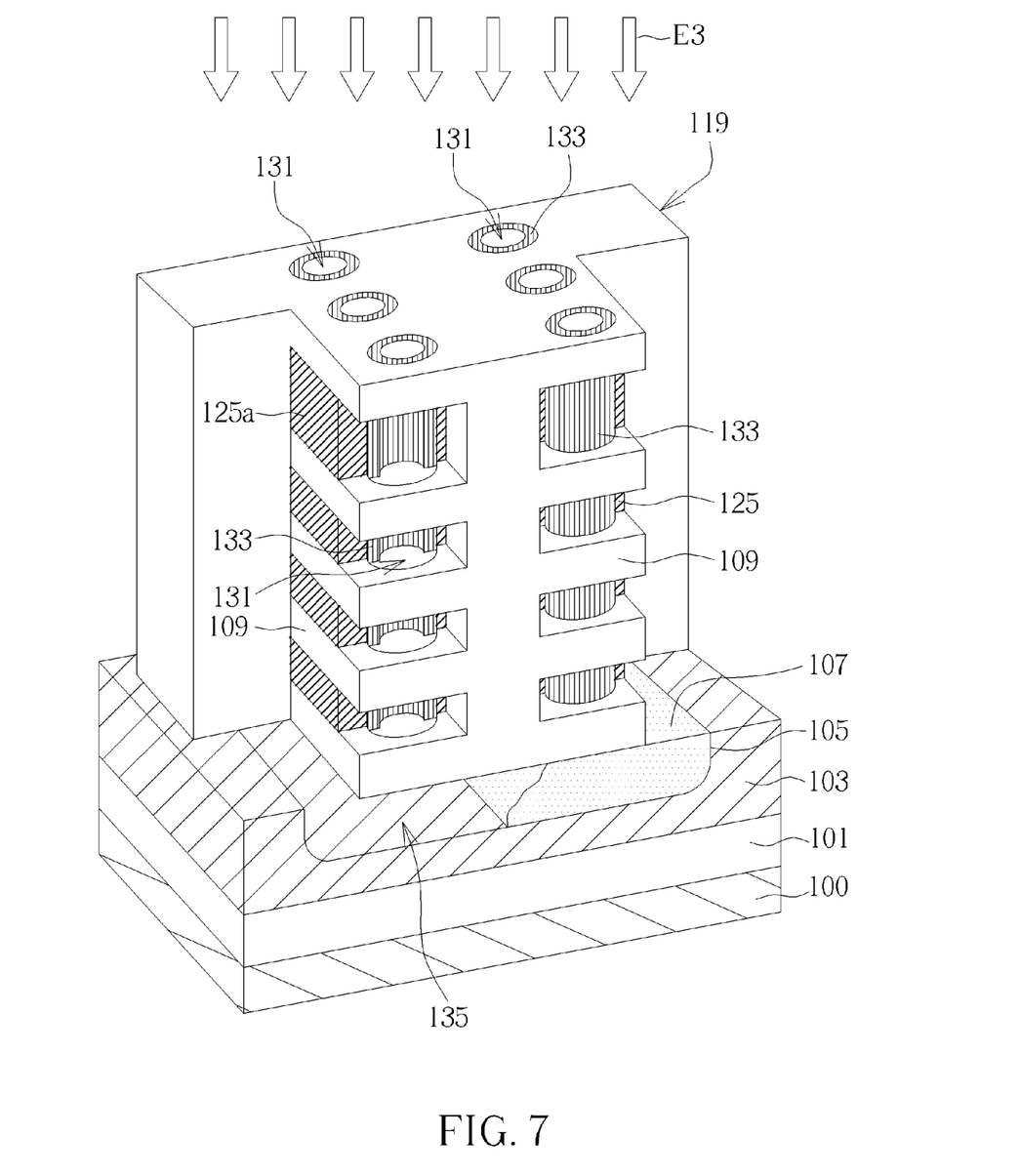

Refer now to FIG. 7. At this stage, the metal layer 125 is formed in each intermediate space 123. The following process is similar to the one described in FIG. 4; the positions once the through holes 121 is formed in two multilayer bodies ML1 and ML2 are once again formed with a plurality of vertical through holes 131. The through holes 131 may be formed by an anisotropic etching process, such as RIE process. As shown in the figure, the through holes penetrate respectively the entire multilayer bodies ML1 and ML2 formed by alternatively stacked insulating intermediate layers 109 and metal layers 125. Accordingly, each metal layer 125 will be provided with communicating through holes 131 penetrating the supporting structure 119 from top to bottom.

This design may facilitate the manufacture of the U-shaped pipe channel structure in later processes.

After the through holes 131 are formed, refer again to FIG. 7, a thin barrier layer 133 is formed on the inner sidewall of the through hole 131. The material of barrier layer 133 may be poly-Si, which may serve as a barrier between the metal layer 125 and other layer structures, for example, the tunnel layer or channel layer to be formed inside the through hole in later processes. The barrier layer 133 may be formed by first depositing a barrier material in the through hole and then removing parts of the barrier material by an etch-back process to form thin, tubular barrier layers 133 on the inner sidewalls of each through hole 131.

In FIG. 7, the left channel portion is illustrated in a cross-sectional view to show the feature of the barrier layer 133 extending along the inner sidewall of the through hole 131 in each metal layer 125a. On the other side, the right channel portion is illustrated to show that the barrier layer 133 is a thin, tubular structure around the through hole 131 and encompassed by the metal layer 125.

After forming the tubular barrier layer 133, refer again to FIG. 7, an etching process E3 similar to the step shown in FIG. 5 is performed to etch the sacrificial bottom layer 107 at the bottom of the supporting structure 119 through the through holes 131. The aforementioned etching process E3 may be a wet etching process using hot phosphoric acid ($H_3PO_4$) as etchant. During the etching process, hot $H_3PO_4$ flows downwardly to the sacrificial bottom layer 107 through the through holes 131. The sacrificial bottom layer 107 made of SiN material will be removed by the hot $H_3PO_4$, thereby forming a shallow recess-like bottom space 135 at the bottom of the supporting structure 119. This bottom space 135 will be used in following processes to form the bottom horizontal portion of the U-shaped pipe channel structure that connects the left and right vertical portions of the U-shaped pipe channel structure. Please note that, in order to clarify the description, the bottom space 135 and the sacrificial bottom layer 107 coexist in the FIG. 7. In fact, the sacrificial bottom layer 107 will be completely removed and empty the entire bottom space 135 after the aforementioned etching process.

Figure 8:
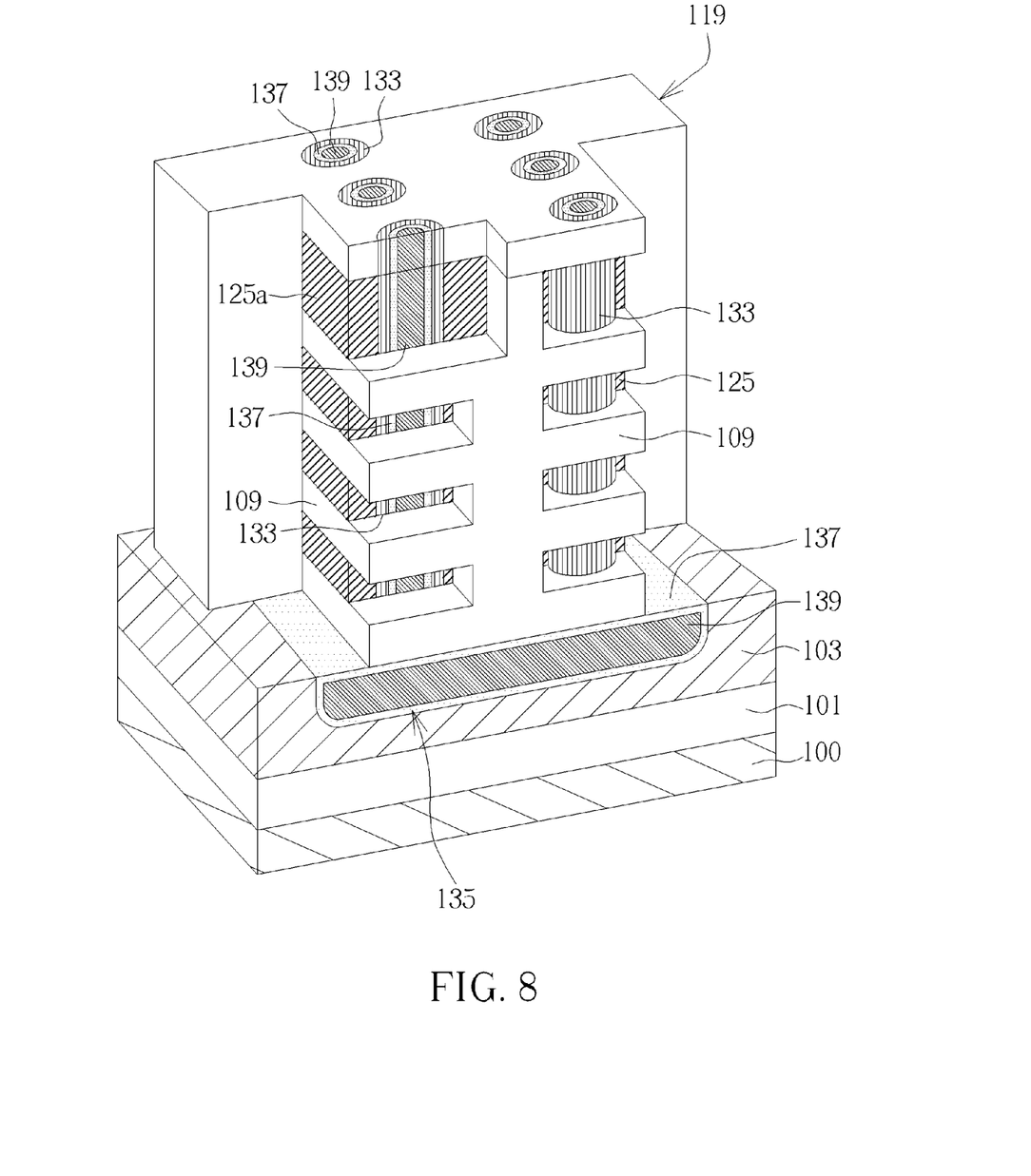

After forming the aforementioned structure, please refer to FIG. 8, a tunnel layer 137 is formed on the inner sidewall of the tubular barrier layer 133 and the inner surface of the bottom space 135. The tunnel layer 137 may be a $SiO_2$—SiN—$SiO_2$ composite layer structure stacked from the outer barrier layer 133 sequentially into the center of the through hole. $Al_2O_3$ may also be one candidate material for the tunnel layer 137. The SiN sub-layer in tunnel layer 137 is encompassed by inner and outer non-conductive $SiO_2$ sub-layers to form a tubular capacitor structure. In this configuration, the SiN sub-layer may serve as the storage layer of the U-shaped 3-D vertical memory structure, while the inner and outer $SiO_2$ sub-layers serve as the insulating layer between the SiN sub-layer and the outer layer structure. Accordingly, every metal layer 125, except the topmost metal layer, may be considered as a metal control gate to control the charge and discharge of the adjacent storage layer (i.e. the SiN sub-layer of the composite tunnel layer 137), thereby achieving the operation of data storage in the memory device. Please note that the aforementioned tubular tunnel layer 137 is extending along the through hole and connecting the tunnel layer 137 formed on the inner surface of the bottom space 135.

After the tunnel layer 137 is formed, please refer to FIG. 8, the through holes 131 and the remaining bottom space 135 are filled up with a conductive material to form a channel layer 139, for example, an n-type or p-type poly-Si layer. This channel layer 139 is encompassed by the tunnel layer 137.

Both of the channel layer 139 and the tunnel layer 137 extend downwardly from the top surface of one supporting structure 119 through the through hole, passing the bottom space 135, to the through hole on the other supporting structure 119, thereby forming a U-shaped pipe channel structure. In both left and right vertical channel portions, the two topmost metal layers are designed to form the source select gate (SGS) and drain select gate (SGD), while other metal layers 125 surround the tunnel layer 137 and the channel layer 139 to serve as respective metal control gates for controlling the data storage of the memory device. Take the multilayer structure shown in the figure for example, one U-shaped pipe channel structure passes through eight metal layers 125. That is, one area unit standing for one U-shaped pipe channel structure may manufacture six memory cells, which is an extremely compact and high-density 3-D vertical memory structure. On the other hand, as shown in FIG. 8, a CMP process must be performed to level the top surface of the U-shaped tubular vertical channel structure and the supporting structure 119 once the channel structure is completed.

Figure 9:
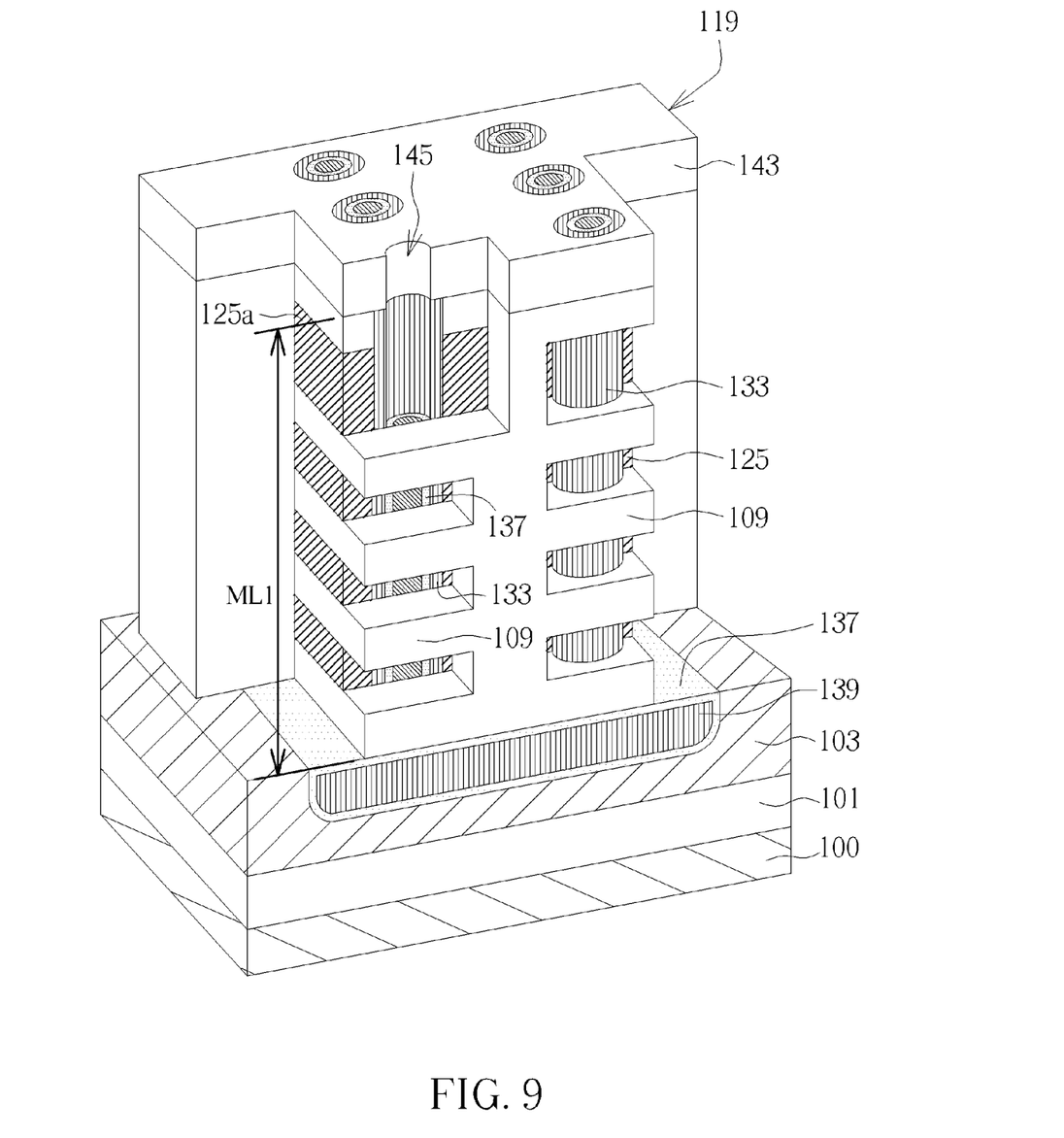

After completing the manufacture of the aforementioned U-shaped pipe channel structure, the following step is to manufacture the select gates and the contact plugs. In the embodiment of present invention, the source select gate (SGS), the drain select gate (SGD) and the contact plugs are manufactured in order. First, an insulating layer 143 is formed on the entire supporting structure 119. The material of the insulating layer 143 may be tetra-ethyl-ortho-silicate (TEOS) or $SiO_2$ for insulating the select gates from the structure such as source lines or bit lines to be formed thereon in later processes. Subsequently, a plurality of contact holes 145 are formed in the insulating layer 143 on the multilayer structure ML1, wherein each contact holes 145 corresponds to a left vertical portion of the U-shaped pipe channel structure. An etch-back process is performed through each contact holes 145 to remove the channel layer 139 in parts of the through hole at the topmost metal layer (i.e. select gate) 125a. The $SiO_2$ layer and the SiN layer exposed from the composite tunnel layer 137 are then sequentially removed by using etchants such as HF and HCl, so that only the barrier layer 133 and the outmost $SiO_2$ layer of the original tunnel layer 137 are kept in the through hole of the select gate. This remaining outmost $SiO_2$ layer is designed to serve as a dielectric layer for the select gate.

Figure 10:
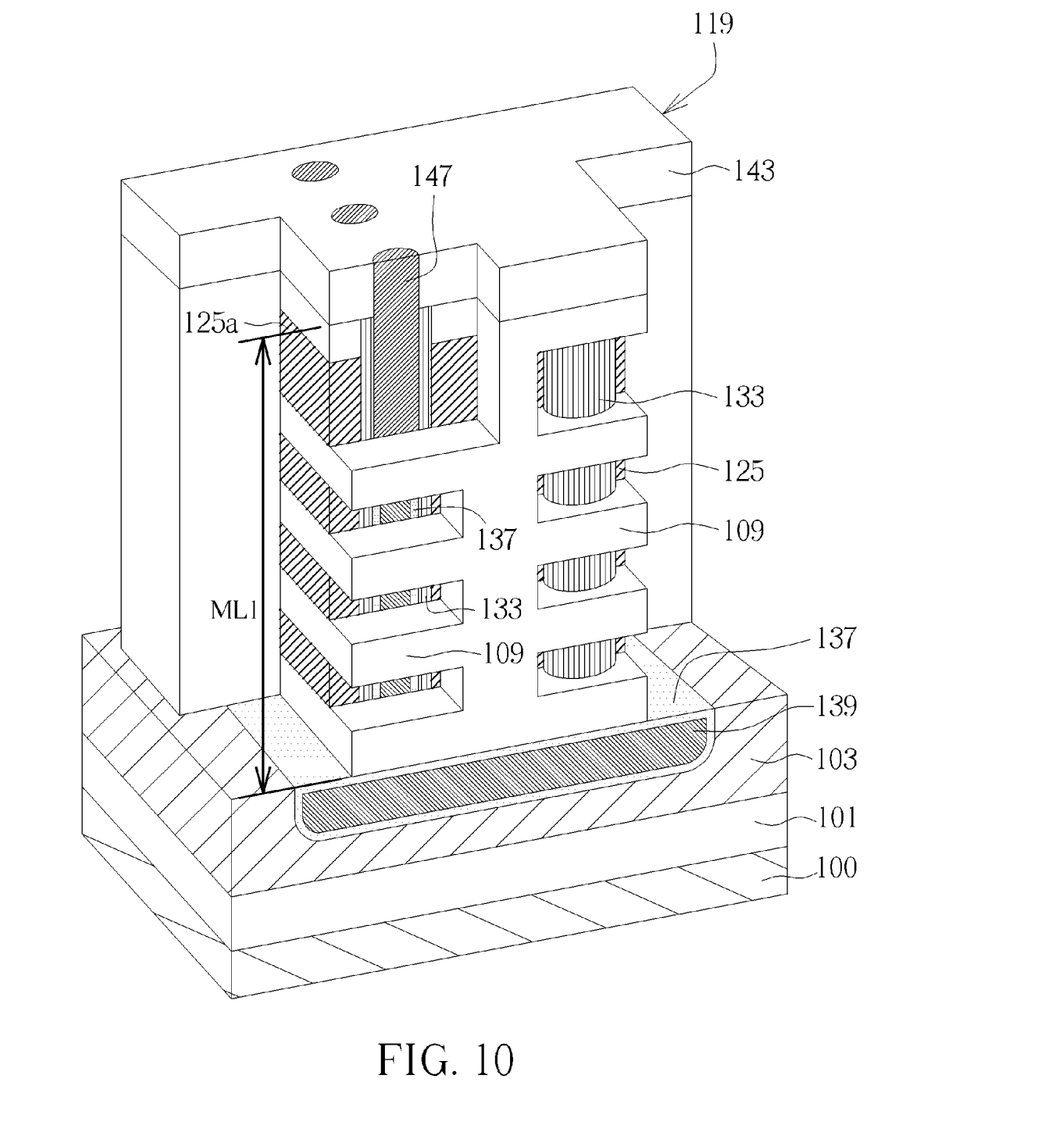

Thereafter, as shown in FIG. 10, parts of the through holes in metal layer (i.e. select gate) 125a and the upper contact holes 145 are filled up with a conductive material, such as an n-type or p-type poly-Si layer, to form a channel layer of the select gate 125a and a contact plug 147. The contact plug 147 is used to connect the underlying select gate and the overlying source line to be formed thereon in following processes.

Figure 11:
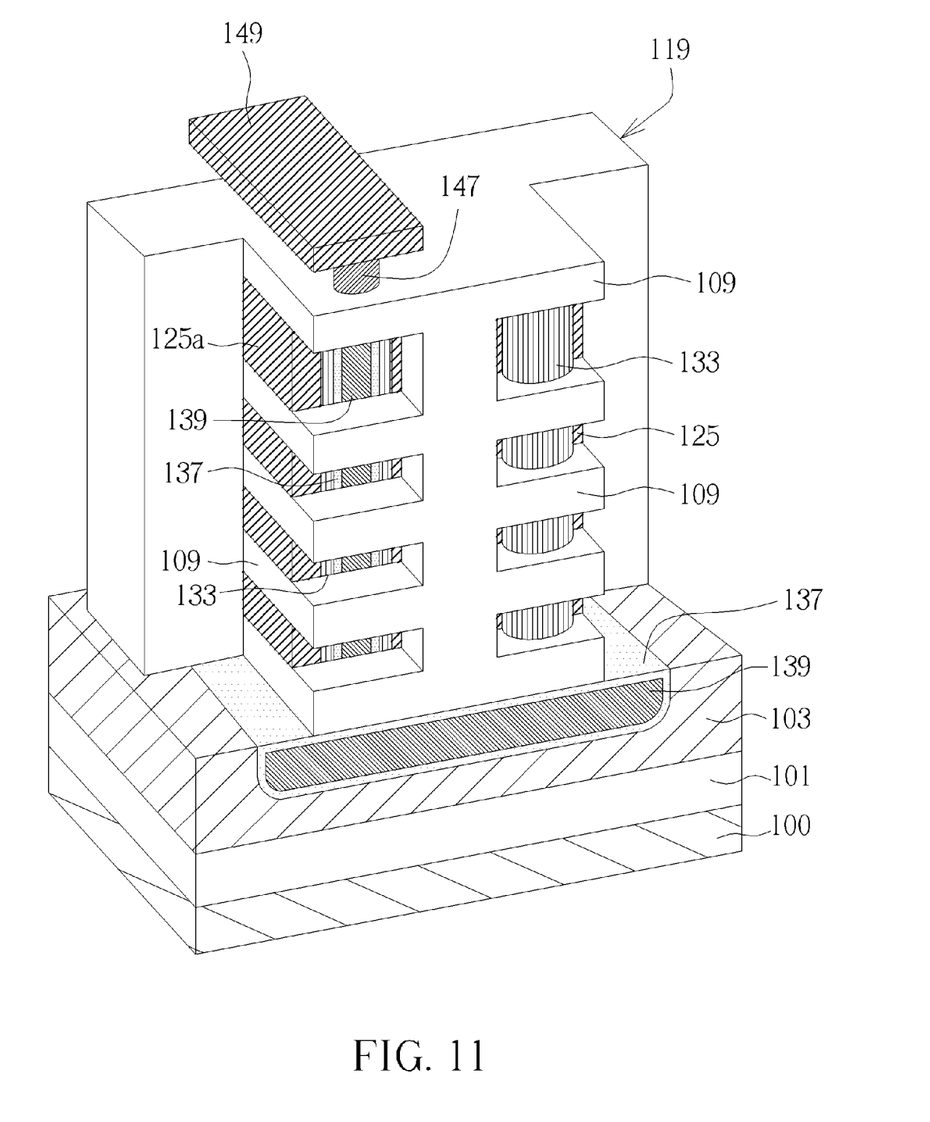
Figure 12:
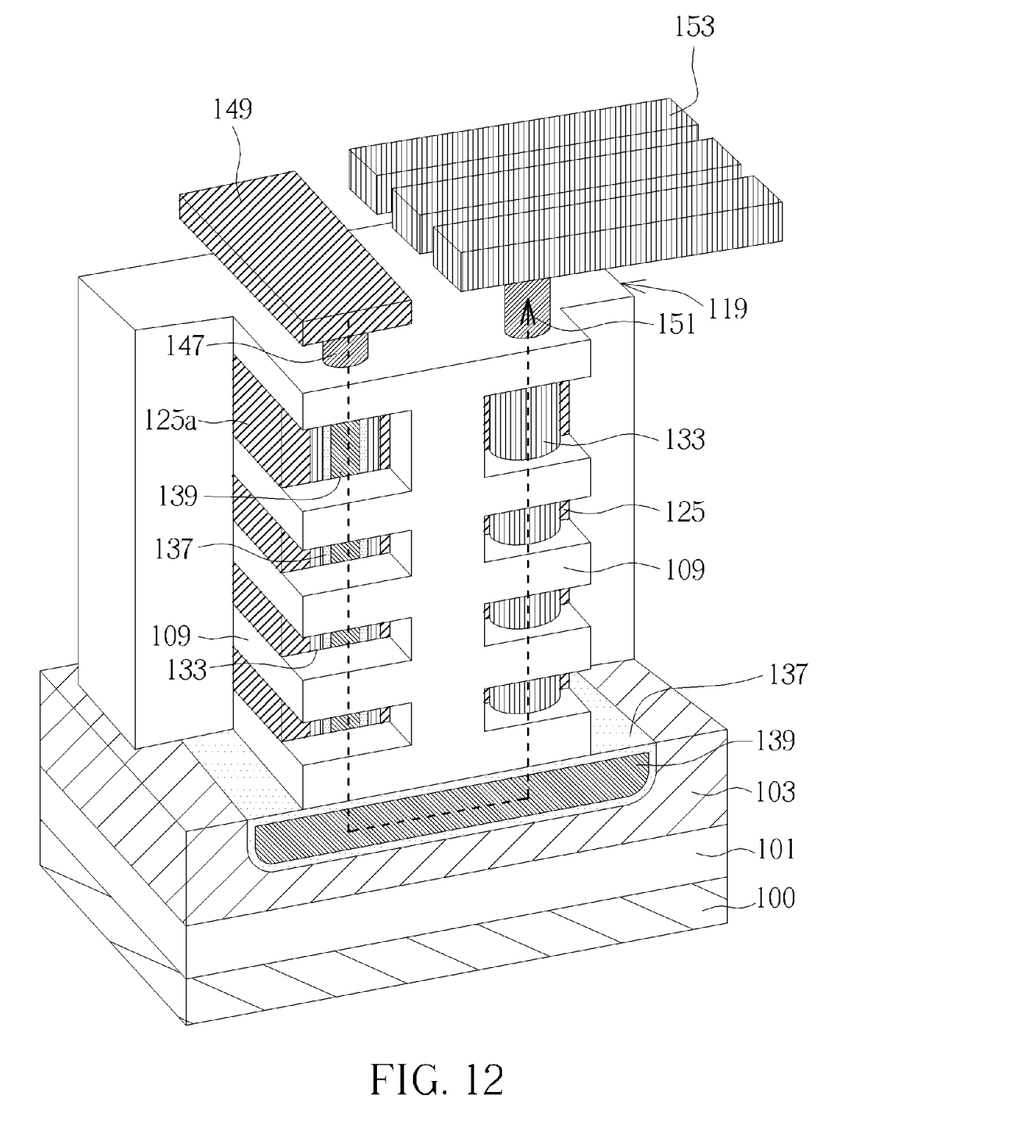

Subsequently, as shown in FIG. 11, a source line (SL) 149 is then formed on the insulating layer 143 to electrically connect a plurality of underlying contact plugs 147. Please note that, to explicitly illustrate the connection between the source line 149 and contact plugs 147, the insulating layer 143 on the multilayer structure ML is not shown in the FIG. 11. As far as the design of present invention is concerned, the storage signal is transmitted into the U-shaped pipe channel structure through the source lines 149 and interacts with the outer metal layer 125 (i.e. control gate) to form an electric field during the transmission, thereby inducing charges in the intermediate tunnel layer 137. Those induced charges will be confined in the tunnel layer 137, which is the operation of data storage in the memory device. In the embodiment of present invention, due to the design of the U-shaped pipe channel structure, the source line 149 will be disposed on the top of entire memory structure, thus the source line may be made of metal material, such as W, Ti, Co, Ni or the alloy thereof, which has lower resistance in comparison to the conventional source line made of doped poly-Si. This design may improve the electrical performances of the entire memory structure.

After completing the manufacture of the aforementioned source select gate (SGS) and the source lines (SL), the following step is to manufacture the drain select gate (SGD) and the bit lines (BL). Similar to the manufacture of source line 149 in previous steps, a plurality of contact holes are formed in the insulating layer 143 on the multilayer structure ML2, wherein each contact hole corresponds to a right vertical channel portion of a U-shaped pipe channel structure. An etch-back process is then performed through each contact hole to remove parts of the channel layer 139 and the tunnel layer 137 surrounded by the topmost metal layer (i.e. drain select gate) 125a. Parts of the through holes in select gate 125a and the upper contact hole are then filled up with contact plugs 151. Subsequently, a plurality of bit lines (BL) 153 are formed on the insulating layer 143, wherein each bit line 153 is electrically connected with an underlying contact plug 151. The manufacture of the drain select gate and of the bit lines are, therefore, completed. Please note that, to explicitly illustrate the connection between the bit lines 153 and the contact plugs 151, the insulating layer 143 on the multilayer structure ML is not shown in FIG. 12. In the embodiment of present invention, the storage signal is transmitted from the source lines 149 to the corresponding bit lines 153 through the U-shaped pipe channel structure, as indicated by the arrow shown in the figure. The aforementioned step of manufacturing the bit lines 153 may include the steps of first forming a conductive layer, such as a metal layer, and then patterning the conductive layer into a plurality of bit lines 153 by a photolithographic process. In an alternative embodiment, the bit lines 153 may overlay the underlying source lines with an insulating layer interfacing there between.

In the preferred embodiment of present invention, the metal layer (i.e. metal control gate) 125 in the supporting structure 119 may extend outwardly from the supporting structure 119 to perform a contact process. As shown in FIG. 13, the multilayer structures ML1 and ML2 extending respectively to both sides of the supporting structure are designed in a ladder-like stacked fashion, wherein the lower metal layer 125 will extend outwardly to an outer position than the upper metal layer 125 does. In this manner, the contact regions of each extended metal layer 125 are not overlaid and may correspond respectively to a position of a word line 161. In such a configuration, a plurality of parallel word lines 161 may be electrically connected to a metal line 125 in one of the multilayer structures ML1 or ML2. Please note that, to clarify the description of the embodiment, the dielectric layer around the word line plug 163 are omitted in the figure. In fact, the word line plug 163 is formed by filling up the contact holes formed in the dielectric layer with metal materials.

Since the control gate (i.e. metal layer 125) in the memory structure of present invention is made of metal materials having a higher etch selectivity in the etching process, the contact holes with different depths may be formed in the dielectric layer through a single etching process, thereby facilitating the manufacture of the ladder-like word line contact structure shown in the figure. This design may easily achieve a contact process with higher process windows and lower manufacture costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a 3-D vertical memory, comprising:
   providing a substrate having a sacrificial bottom layer;
   forming a multilayer structure composed of a plurality of alternatively stacked insulating intermediate layers and sacrificial intermediate layers;
   dividing said multilayer structure into a first multilayer structure and a second multilayer structure;
   forming an insulating layer encompassing said first multilayer structure and said second multilayer structure;
   forming a plurality of first through holes penetrating through said first multilayer structures and said second multilayer structures;
   removing said sacrificial intermediate layers in said first multilayer structure and said second multilayer structure to form a plurality intermediate spaces;
   forming metal layers in said intermediate spaces and said first through holes;
   removing a portion of said metal layers to form a plurality of second through holes penetrating through said first multilayer structure and said second multilayer structure;
   removing said sacrificial bottom layer to form an empty bottom space; and
   forming interconnected channel structures in said second through holes and said bottom space.

2. The method of manufacturing a 3-D vertical memory according to claim 1, wherein the step of forming said channel structures comprises sequentially forming a barrier layer, a tunnel layer and a channel layer on sidewalls of said second through holes.

3. The method of manufacturing a 3-D vertical memory according to claim 2, wherein said barrier layer is a polycrystalline silicon layer.

4. The method of manufacturing a 3-D vertical memory according to claim 2, wherein said tunnel layer is a composite layer composed of an oxide layer, a storage layer and an oxide layer.

5. The method of manufacturing a 3-D vertical memory according to claim 4, wherein the material of said storage layer comprises silicon nitride (SiN) or aluminum oxide ($Al_2O_3$).

6. The method of manufacturing a 3-D vertical memory according to claim 4, wherein the material of said oxide layer is silicon oxide ($SiO_2$).

7. The method of manufacturing a 3-D vertical memory according to claim 2, wherein said channel layer is an n-type or a p-type polycrystalline silicon layer.

8. The method of manufacturing a 3-D vertical memory according to claim 1, wherein said metal layers formed in said intermediate spaces at topmost layers of said first multilayer structure and said second multilayer structure serve as select gates, wherein said select gate in said first multilayer structure serves as a source select gate (SGS) and said select gate in said second multilayer structure serves as a drain select gate (SGD).

9. The method of manufacturing a 3-D vertical memory according to claim 8, further comprising the step of removing parts of said tunnel layer and said channel layer in said second through holes after forming said channel structures and then filling up a conductive material in said second through holes so as to form channel layers of select gates and contact plugs respectively in said first multilayer structure and said second multilayer structure.

10. The method of manufacturing a 3-D vertical memory according to claim 9, further comprising the step of forming a source line and a plurality of bit lines respectively on said first multilayer structure and said second multilayer structure, wherein said source line is connected to said contact plugs in said first multilayer structure and each said bit line is connected to one of said contact plugs in said second multilayer structure.

11. The method of manufacturing a 3-D vertical memory according to claim 10, wherein the material of said source line comprises W, Ti, Co, Ni or an alloy thereof.

12. The method of manufacturing a 3-D vertical memory according to claim 10, wherein the material of said bit line comprises W, Ti, Co, Ni or an alloy thereof.

13. The method of manufacturing a 3-D vertical memory according to claim 1, wherein said metal layers formed in each said intermediate space, except topmost said intermediate space in said first multilayer structure and said second multilayer structure, serve as control gates.

14. The method of manufacturing a 3-D vertical memory according to claim 1, wherein said first and second through holes are formed by reactive ion etching process.

15. The method of manufacturing a 3-D vertical memory according to claim 1, wherein said sacrificial intermediate layers or said sacrificial bottom layer are removed by a wet etching process using hot phosphoric acid.

16. The method of manufacturing a 3-D vertical memory according to claim 1, wherein said metal layers are extending outwardly to form a ladder-like stacked structure, and each metal layer are connected to a word line through word line plugs.

17. The method of manufacturing a 3-D vertical memory according to claim 1, wherein the thickness of topmost said sacrificial intermediate layer in said first multilayer structure and said second multilayer structure is approximately two or three times the thickness of remaining lower sacrificial intermediate layers.

* * * * *